(12) United States Patent
Chao et al.

(10) Patent No.: US 12,187,843 B2
(45) Date of Patent: Jan. 7, 2025

(54) LIQUID COMPRESSION MOLDING OR ENCAPSULANT COMPOSITIONS

(71) Applicant: Henkel AG & Co. KGaA, Duesseldorf (DE)

(72) Inventors: Jay Chao, Irvine, CA (US); Gina V. Hoang, Garden Grove, CA (US); Rong Zhang, Irvine, CA (US)

(73) Assignee: Henkel AG & Co. KGaA, Duesseldorf (DE)

( * ) Notice: Subject to any disclaimer, the term of this patent is extended or adjusted under 35 U.S.C. 154(b) by 622 days.

(21) Appl. No.: 17/174,483

(22) Filed: Feb. 12, 2021

(65) Prior Publication Data

US 2021/0163674 A1 Jun. 3, 2021

Related U.S. Application Data

(63) Continuation of application No. PCT/US2019/046809, filed on Aug. 16, 2019.

(60) Provisional application No. 62/765,172, filed on Aug. 17, 2018.

(51) Int. Cl.
    *C08G 59/40* (2006.01)
    *C08K 3/36* (2006.01)
    *H01L 23/29* (2006.01)

(52) U.S. Cl.
    CPC ............ *C08G 59/4014* (2013.01); *C08K 3/36* (2013.01); *H01L 23/295* (2013.01)

(58) Field of Classification Search
    None
    See application file for complete search history.

(56) References Cited

U.S. PATENT DOCUMENTS

| | | | |
|---|---|---|---|
| 4,477,629 A | 10/1984 | Hefner, Jr. | |
| 4,528,366 A | 7/1985 | Woo et al. | |
| 6,147,169 A * | 11/2000 | Ohnishi | C09D 163/00 |
| | | | 548/335.1 |
| 6,727,325 B1 | 4/2004 | Suzuki et al. | |
| 8,847,415 B1 | 9/2014 | Bai et al. | |
| 9,263,360 B2 | 2/2016 | Bai | |
| 10,851,201 B2 | 12/2020 | Beisele et al. | |
| 2013/0026660 A1 | 1/2013 | Czubarow et al. | |
| 2014/0008822 A1 | 1/2014 | Bai | |
| 2017/0349696 A1 | 12/2017 | Ono | |
| 2018/0142058 A1 | 5/2018 | Beisele et al. | |

FOREIGN PATENT DOCUMENTS

| | | |
|---|---|---|
| GB | 1305702 A | 2/1973 |
| JP | 2000080154 A | 3/2000 |
| JP | 2008001748 A | 1/2008 |

(Continued)

OTHER PUBLICATIONS

Kumar A et al.: "Wafer level embedding technology for 3D wafer level embedded package", Electronic Components and Technology Conference, 2009. ECTC 2009. 59TH, IEEE, Piscataway, NJ, USA, pp. 1289-1296 (2009).

*Primary Examiner* — Bo B Jang
(74) *Attorney, Agent, or Firm* — Steven C. Bauman

(57) ABSTRACT

Thermosetting resin compositions useful for liquid compression molding encapsulation of a reconfigured wafer are provided. The so-encapsulated molded wafer offers improved resistance to warpage, compared to reconfigured wafers encapsulated with known encapsulation materials.

9 Claims, 1 Drawing Sheet

(56) References Cited

FOREIGN PATENT DOCUMENTS

| | | | |
|---|---|---|---|
| JP | 2018174577 | A | 7/2008 |
| JP | 2010195998 | A | 9/2010 |
| JP | 2016094562 | A | 5/2016 |
| KR | 20180008782 | A | 1/2018 |
| WO | 85/02184 | A1 | 5/1985 |

* cited by examiner

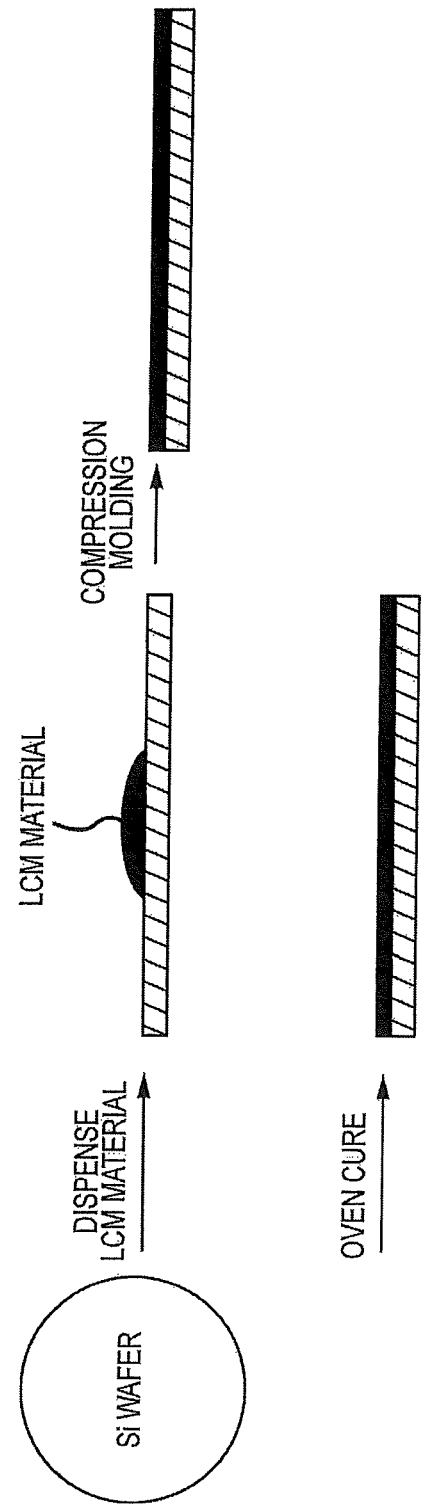

LIQUID COMPRESSION MOLDING OR ENCAPSULANT COMPOSITIONS

BACKGROUND

Field

Thermosetting resin compositions useful for liquid compression molding ("LCM") or encapsulation applications are provided, which offer improved resistance to warpage, compared to LCM or encapsulation with known materials.

Brief Description of Related Technology

As semiconductor packaging evolves, requirement for material encapsulation is changing. To protect electronic parts, such as semiconductor devices, conventional method is using transfer molding by applying solid epoxy resin compositions. However, with semiconductor devices getting thinner and more densely packed, the method is limited due to flowing defects occurring near the fine openings, and potential damage to some delicate parts.

Therefore, LCM or encapsulation has developed as a processing technique to help protect electronic devices. Compared to transfer molding, LCM or encapsulation is advantageous, in that resin flows more readily into narrow gaps and there is less likelihood of damaging the electronic parts. Many semiconductor wafer-level packaging ("WLP") already used LCM to encapsulate thin and delicate devices.

However, there are many issues for LCM or encapsulation to meet the need for commercial volumes and the reliability needed in the semiconductor packaging industry, particularly for WLP.

Warpage is a common problem seen with many cured LCM or liquid encapsulants. This is particularly prevalent with anhydride-cured epoxy compositions. When packaging size is getting larger and thickness continuously going down, the warpage problem could become too severe to meet the process requirement, potentially leading to semiconductor packaging failure.

To address the warpage issue, many LCM or liquid encapsulants have been formulated to reduce modulus and glass transition temperatures ("Tg"). However, when proceeding down this path, the encapsulated packages have less of a chance to pass reliability testing.

LCM or liquid encapsulants that are cured with anhydrides ordinarily have poor viscosity stability at room temperature or upon heat ramping. The viscosity instability could cause manufacturing difficulties and process uncertainty.

Conventional materials used to form the molded wafer have either not possessed the desired physical properties to offer improved resistance to wafer warpage, or have not lent themselves to application by liquid compression molding techniques.

In the past, attempts have been made to address the warpage issue. For instance, U.S. Pat. No. 9,263,360 is directed to and claims a thermosetting resin composition, comprising a thermosetting resin matrix comprising the combination of an epoxy resin component, and an epoxy curing agent consisting of a phenolic novolac component, optionally an additional component selected from an episulfide resin, an oxazine, an oxazoline, a cyanate ester, a maleimide, a nadimide, an itaconimide, and combinations thereof; a block copolymer, a silica filler and optionally a catalyst and accelerator. Here, the block copolymer is an amphiphilic one selected from copolymers made from polystyrene, 1,4-polybutadiene and syndiotactic poly(methyl methacrylate); polymethylmethacrylate-block-polybutylacrylate-block polymethylmethacrylate copolymers; and combinations thereof. The silica filler comprises 50 to 90 percent by weight of the composition.

And U.S. Pat. No. 8,847,415 is directed to and claims a liquid compression molding curable resin composition, comprising a curable resin matrix, a cure component comprising a cationic catalyst and an oxidant. When cured, the composition exhibits a DSC peak below 140° C. and a delta temperature between the onset temperature and the peak on DSC below 20° C.

U.S. Pat. No. 9,263,360 provides a thermosetting resin composition, comprising a thermosetting resin matrix, a block copolymer, a silica filler and a cure component comprising the combination of an anhydride or a phenolic resin and an imidizole. When cured the composition exhibits a modulus in the range of about 22 GPas or less at room temperature, a CTE α1 of less than or equal to 10 ppm, and multiple Tgs that include for instance a $T_{g1}$ of about −70° C. to −30° C. and a $T_{g2}$ of about 100° C. to 150° C.

And in unrelated technology U.S. Pat. No. 6,727,325 is directed to and claims an epoxy resin composition, comprising an epoxy resin prior to curing, and a clathrate comprising a tetrakisphenol compound represented by a specified formula and a compound reacting with an epoxy group of the epoxy resin to cure the resin.

Despite these recent efforts, it would be desirable to provide alternative LCM or encapsulation materials, which are capable of showing improved viscosity stability at room temperature and providing improved resistance to wafer warpage, thereby giving the end user multiple choices and sources of solutions to the recurring problem of wafer warpage.

SUMMARY

Thermosetting resin compositions that are capable of improving viscosity stability and reducing, after cure, molded wafer warpage are provided. More specifically, the inventive compositions are useful as liquid compression molding encapsulants having low warpage after compression molding and oven cure, while maintaining the physical properties of a molding compound.

The compositions exhibit low storage modulus at room temperature (such as about 25 GPa or less, desirably within the range of about 10 to about 20 Gpa, such as about 5 to about 9 Gpa, at room temperature), low coefficients of thermal expansion ("CTEs") (α1<15 ppm; α2<30 ppm), and at least one glass transition temperature [$T_g$ above about 135° C. by Thermal Mechanical Analysis ("TMA")].

In addition, and importantly, the compositions demonstrate a viscosity change of less than 30% in 24 hours at room temperature (25° C.), measured by rheometer (ARES rheometer from TI) and a warpage of less than about 3 cm (such as less than about 2 cm) after curing under compressing molding conditions. This physical property combination shows promise in overcoming some of the significant technical hurdles facing the semiconductor packaging industry at present, particularly with respect to liquid encapsulant viscosity instability and wafer warpage.

Thus, provided in one aspect is a thermosetting resin composition, which reaction product includes a thermosetting resin matrix (such as an epoxy resin component), a filler, and a cure component comprising the combination of (1) a clathrate comprising a tetrakis phenol compound and (2) a nitrogen containing curing agent, such as imidazole and derivatives thereof.

In another aspect, provided is a method of improving warpage resistance to a molded wafer, steps of which include:

providing a wafer on which is disposed one or more silicon chips;

providing a thermosetting resin composition as so described in contact with the wafer; and exposing the wafer and the thermosetting resin composition to conditions favorable to allow the thermosetting resin composition to flow about the wafer and cure to a reaction product of the thermosetting resin composition. The cured reaction product is capable of improving warpage resistance of the molded wafer by about 50%, desirably at least about 65%, and even more desirably at least about 80%, as compared with a molded wafer with a material other than that which is disclosed herein. The wafer is constructed of silicon and the composition is disposed on the wafer at a thickness of less than about 50 percent of the thickness of the wafer, such as at a thickness of less than about 33 percent of the thickness of the wafer.

BRIEF DESCRIPTION OF THE FIGURE

FIG. 1 depicts a process flow diagram of a liquid compression molding encapsulation process for a wafer level packaging application.

DETAILED DESCRIPTION

The thermosetting resin compositions as noted above, include among other constituents a thermosetting resin matrix (such as an epoxy resin component).

Examples of the epoxy resin component include epoxies made from bisphenol A, bisphenol F, bisphenol S, bisphenol E, biphenyl or combinations thereof. In addition, two or more different bisphenol epoxies (or hydrogenated versus thereof) within the same type of resin (such as A, F, S or E) may be used.

Commercially available examples of the bisphenol epoxies desirable for use herein include bisphenol-F epoxies [such as RE-404-S from Nippon Kayaku, Japan, and EPI-CLON 830 (RE1801), 830S (RE1815), 830A (RE1826) and 830W from Dai Nippon Ink & Chemicals, Inc., and RSL 1738 and YL-983U from Resolution] and bisphenol-A epoxies (such as YL-979 and 980 from Resolution).

The bisphenol epoxies available commercially from Dai Nippon and noted above are promoted as liquid undiluted epichlorohydrin-bisphenol F epoxies having lower viscosities than conventional epoxies based on bisphenol A epoxies and have physical properties similar to liquid bisphenol A epoxies. Bisphenol F epoxy has a lower viscosity than bisphenol A epoxy, all else being the same between the two types of epoxies, which affords a lower viscosity and thus a fast flow underfill sealant material. The EEW of these four bisphenol F epoxies is between 165 and 180. The viscosity at 25° C. is between 3,000 and 4,500 cps (except for RE1801 whose upper viscosity limit is 4,000 cps). The bisphenol A epoxies have a EEW (g/eq) of between 180 and 195 and a viscosity at 25° C. of between 100 and 250 cps.

The bisphenol epoxies available commercially from Resolution and noted above are promoted as low chloride containing liquid epoxies. The total chloride content for the RSL-1738 bisphenol A epoxy is reported as between 500 and 700 ppm, and that for YL-983U as between 150 and 350 ppm.

Among the epoxies suitable for use herein also include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.

In addition to the bisphenol epoxies, other epoxy compounds may be included within the epoxy component. For instance, cycloaliphatic epoxies, such as 3,4-epoxycyclohexylmethyl-3,4-epoxycyclohexylcarbonate, or hydrogenated versions of the bisphenol or biphenyl epoxies may be used.

Also monofunctional, difunctional or multifunctional reactive diluents to adjust the viscosity and/or lower the Tg are also used, such as butyl glycidyl ether, cresyl glycidyl ether, polyethylene glycol glycidyl ether or polypropylene glycol glycidyl ether. Appropriate monofunctional epoxy coreactant diluents for use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters and $C_{10-28}$ alkylphenol glycidyl ethers.

In the event such a monofunctional epoxy coreactant diluent is included, such coreactant diluent should be employed in an amount of up to about 5 percent by weight to about 15 percent by weight, such as about 8 percent by weight to about 12 percent by weight, based on the total weight of the thermosetting resin matrix.

The epoxy resin component should be present in the composition in an amount which the range of about 10 percent by weight to about 95 percent by weight, desirably about 20 percent by weight to about 80 percent by weight, such as about 60 percent by weight, based on the total weight of the thermosetting resin matrix.

In addition to the epoxy resin component, other reactive components may be included such as an episulfide resin component, an oxazine component, an oxazoline component, a cyanate ester component, and/or a maleimide-, a nadimide- or an itaconimide-containing component.

As an episulfide resin, any of the aforementioned epoxies may be used where the oxirane oxygen atom has been replaced by a sulfur atom.

Oxazines may be embraced by the structure

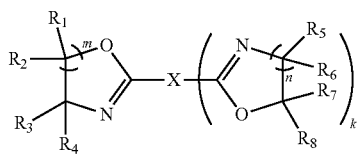

where here $R_1$-$R_8$ are each individually members selected from hydrogen, $C_{1-40}$ alkyl, $C_{2-40}$ alkenyl, the latter two of which being optionally interrupted by one or more of O, N, S, C=O, COO, or NHC=O or substituted by one or more of OH, OR, NRR, SH, SR, COOH, COOR, NHCOOH or NHCOOR, where R is selected from $C_{1-40}$ alkyl, $C_{2-40}$ alkenyl, or $C_{6-20}$ aryl, X is a linkage selected broadly from alkylene, alkenylene, or arylene, optionally interrupted by one or more of O, NR, S, C=O, COO, or NHC=O or substituted by one or more of OH, OR, NRR, SH, SR, COOH, COOR, NHCOOH or NHCOOR, where R is selected from $C_{1-40}$ alkyl, $C_{2-40}$ alkenyl, or $C_{6-20}$ aryl, m and n are each individually 1 or 2, and k is 0 to 6.

The oxazine resin component should be present in the composition in an amount which the range of about 10 percent by weight to about 95 percent by weight, desirably about 20 percent by weight to about 80 percent by weight, such as about 60 percent by weight, based on the total weight of the thermosetting resin matrix.

A more specific example of the oxazine resin component is a benzoxazine resin, examples of which may be embraced by

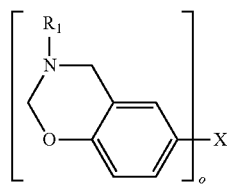

where o is 1-4, X is defined below, and $R_1$ is alkyl, such as methyl, ethyl, propyls or butyls, or

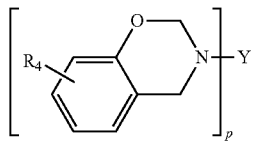

where p is 1-4, Y is defined below, and $R_4$ is selected from hydrogen, halogen, alkyl or alkenyl.

X and Y in the benzoxazine structures above may independently be selected from a monovalent or polyvalent radical that include hydrocarbyl or substituted hydrocarbyl species typically having in the range of about 6 up to about 500 carbon atoms, where the hydrocarbyl species is selected from alkyl, alkenyl, alkynyl, cycloalkyl, cycloalkenyl, aryl, alkylaryl, arylalkyl, aryalkenyl, alkenylaryl, arylalkynyl or alkynylaryl, provided, however, that X can be aryl only when X comprises a combination of two or more different species;

hydrocarbylene or substituted hydrocarbylene species typically having in the range of about 6 up to about 500 carbon atoms, where the hydrocarbylene species are selected from alkylene, alkenylene, alkynylene, cycloalkylene, cycloalkenylene, arylene, alkylarylene, arylalkylene, arylalkenylene, alkenylarylene, arylalkynylene or alkynylarylene, heterocyclic or substituted heterocyclic species typically having in the range of about 6 up to about 500 carbon atoms, polysiloxane, and polysiloxane-polyurethane block copolymers, and combinations of one or more of the above with a linker selected from covalent bond, —O—, —S—, —NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, or —NR—P(O)R$_2$—; where each R is independently hydrogen, alkyl or substituted alkyl.

When one or more of the above described "X" or "Y" linkages cooperate to form the appendage of a benzoxazine group, as readily recognized by those of skill in the art, a wide variety of organic chains can be produced, such as, for example, oxyalkyl, thioalkyl, aminoalkyl, carboxylalkyl, oxyalkenyl, thioalkenyl, aminoalkenyl, carboxyalkenyl, oxyalkynyl, thioalkynyl, aminoalkynyl, carboxyalkynyl, oxycycloalkyl, thiocycloalkyl, aminocycloalkyl, carboxycycloalkyl, oxycloalkenyl, thiocycloalkenyl, aminocycloalkenyl, carboxycycloalkenyl, heterocyclic, oxyheterocyclic, thioheterocyclic, aminoheterocyclic, carboxyheterocyclic, oxyaryl, thioaryl, aminoaryl, carboxyaryl, heteroaryl, oxyheteroaryl, thioheteroaryl, aminoheteroaryl, carboxyheteroaryl, oxyalkylaryl, thioalkylaryl, aminoalkylaryl, carboxyalkylaryl, oxyarylalkyl, thioarylalkyl, aminoarylalkyl, carboxyarylalkyl, oxyarylalkenyl, thioarylalkenyl, aminoarylalkenyl, carboxyarylalkenyl, oxyalkenylaryl, thioalkenylaryl, aminoalkenylaryl, carboxyalkenylaryl, oxyarylalkynyl, thioarylalkynyl, aminoarylalkynyl, carboxyarylalkynyl, oxyalkynylaryl, thioalkynylaryl, aminoalkynylaryl or carboxyalkynylaryl. oxyalkylene, thioalkylene, aminoalkylene, carboxyalkylene, oxyalkenylene, thioalkenylene, aminoalkenylene, carboxyalkenylene, oxyalkynylene, thioalkynylene, aminoalkynylene, carboxyalkynylene, oxycycloalkylene, thiocycloalkylene, aminocycloalkylene, carboxycycloalkylene, oxycycloalkenylene, thiocycloalkenylene, aminocycloalkenylene, carboxycycloalkenylene, oxyarylene, thioarylene, aminoarylene, carboxyarylene, oxyalkylarylene, thioalkylarylene, aminoalkylarylene, carboxyalkylarylene, oxyarylalkylene, thioarylalkylene, aminoarylalkylene, carboxyarylalkylene, oxyarylalkenylene, thioarylalkenylene, aminoarylalkenylene, carboxyarylalkenylene, oxyalkenylarylene, thioalkenylarylene, aminoalkenylarylene, carboxyalkenylarylene, oxyarylalkynylene, thioarylalkynylene, aminoarylalkynylene, carboxy arylalkynylene, oxyalkynylarylene, thioalkynylarylene, aminoalkynylarylene, carboxyalkynylarylene, heteroarylene, oxyheteroarylene, thioheteroarylene, aminoheteroarylene, carboxyheteroarylene, heteroatom-containing di- or polyvalent cyclic moiety, oxyheteroatom-containing di- or polyvalent cyclic moiety, thioheteroatom-containing di- or polyvalent cyclic moiety, aminoheteroatom-containing di- or polyvalent cyclic moiety, carboxyheteroatom-containing di- or polyvalent cyclic moiety, and the like.

The benzoxazine resin component should be present in the composition in an amount which the range of about 10 percent by weight to about 95 percent by weight, desirably about 20 percent by weight to about 80 percent by weight, such as about 60 percent by weight, based on the total weight of the thermosetting resin matrix.

As a cyanate ester component, compounds having the general structural formula below may be used:

(I)

where here m is from 2 to 5 and $R^1$ is an aromatic nucleus-containing residue. $R^1$ should contain at least 6 carbon atoms and may be derived, for example, from aromatic hydrocarbons, such as benzene, biphenyl, naphthalene, anthracene, pyrene or the like. The aromatic residue may be also be derived from a polynuclear aromatic hydrocarbon in which at least two aromatic rings are attached to each other through a bridging group, such as where the bridging member has the formula

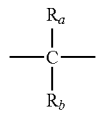

where $R_a$ and $R_b$ are the same or different and each represents a hydrogen atom or an alkyl group containing 1 to 4 carbon atoms. $R^1$ also includes residues derived from novolac-type phenolic resins—i.e. cyanate esters of these phenolic resins. $R^1$ may also contain further ring attached, non-reactive substituents.

Examples of useful cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane and 3,3',5,5'-tetramethyl, bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-(methylethylidene)]benzene and cyanated, bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Patent No. 1,305,702, and the cyanate esters disclosed in International Patent Publication No. WO 85/02184, the disclosure of each of which is hereby expressly incorporated herein by reference.

Particularly desirable cyanate esters for use herein are available commercially from Hunstman Advanced Materials, Tarrytown, N.Y. under the tradename "AROCY" [1,1-di(4-cyanatophenylethane)]. The structures of four desirable "AROCY" cyanate esters are

"AROCY" B-10

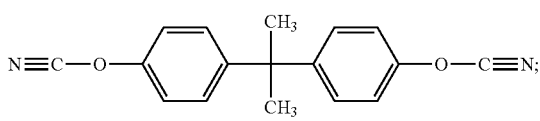

"AROCY" M-30

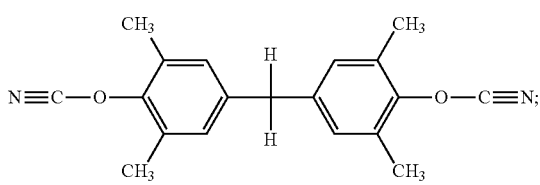

"AROCY" L-10

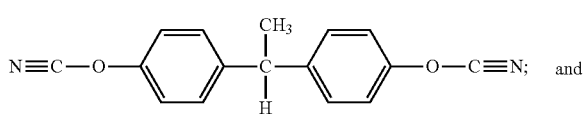
and

"AROCY" B-30

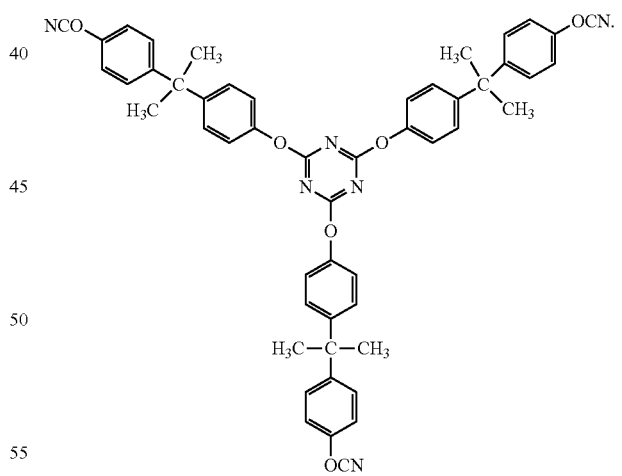

The cyanate ester resin component should be present in the composition in an amount which the range of about 10 percent by weight to about 95 percent by weight, desirably about 20 percent by weight to about 80 percent by weight, such as about 60 percent by weight, based on the total weight of the thermosetting resin matrix.

As a maleimide, nadimide or itaconimide, compounds having the general respective structural formulae below may be used:

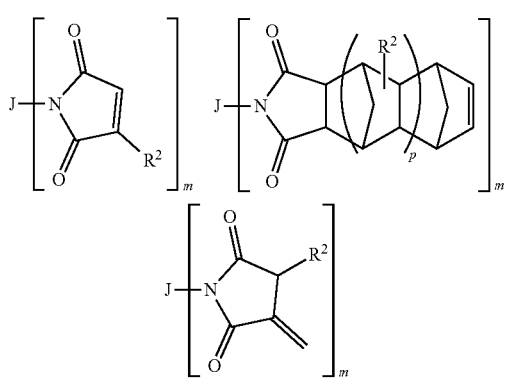

where here m is 1-15, p is 0-15, each $R^2$ is independently selected from hydrogen or lower alkyl (such as $C_{1-5}$), and J is a monovalent or a polyvalent radical comprising organic or organosiloxane radicals, and combinations of two or more thereof, such as are defined as "X" and "Y" with respect to the benzoxazine structure above.

Monovalent or polyvalent radicals include hydrocarbyl or substituted hydrocarbyl species typically having a range of about 6 up to about 500 carbon atoms. The hydrocarbyl species may be alkyl, alkenyl, alkynyl, cycloalkyl, cycloalkenyl, aryl, alkylaryl, arylalkyl, arylalkenyl, alkenylaryl, arylalkynyl and alkynylaryl.

Additionally, X may be a hydrocarbylene or substituted hydrocarbylene species typically having in the range of about 6 up to about 500 carbon atoms. Examples of hydrocarbylene species include but are not limited to alkylene, alkenylene, alkynylene, cycloalkylene, cycloalkenylene, arylene, alkylarylene, arylalkylene, arylalkenylene, alkenylarylene, arylalkynylene and alkynylarylene.

The maleimide, itaconamide or nadimide may be in liquid or solid form.

In a desired embodiment, the maleimide, itaconamide or nadimide functional groups are separated by a polyvalent radical having sufficient length and branching to render the maleimide containing compound a liquid. The maleimide, itaconamide or nadimide compound may contain a spacer between maleimide functional groups comprising a branched chain alkylene between maleimide, itaconamide or nadimide functional groups.

In the case of maleimide-containing compounds, the maleimide compound desirably is a stearyl maleimide, oleyl maleimide, a biphenyl maleimide or a 1,20-bismaleimido-10,11-dioctyl-eixosane or combinations of the above.

Again in the case of maleimide-containing compounds, the maleimide compound may be prepared by reaction of maleic anhydride with dimer amides or prepared from aminopropyl-terminated polydimethyl siloxanes, polyoxypropylene amines, polytetramethyleneoxide-di-p-aminobenzoates, or combinations thereof.

Particularly desirable maleimides and nadimides include

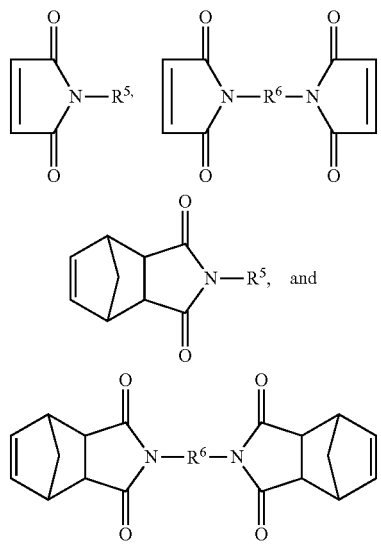

where $R^5$ and $R^6$ are each selected from alkyl, aryl, aralkyl or alkaryl groups, having from about 6 to about 100 carbon atoms, with or without substitution or interruption by a member selected from silane, silicon, oxygen, halogen, carbonyl, hydroxyl, ester, carboxylic acid, urea, urethane, carbamate, sulfur, sulfonate and sulfone.

Other desirable maleimides, nadimides, and itaconimides include

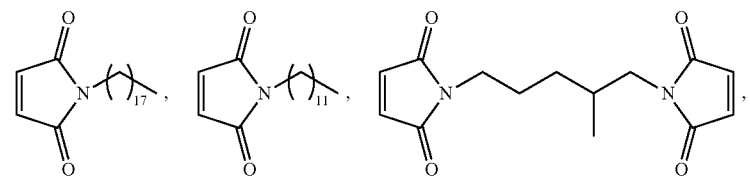

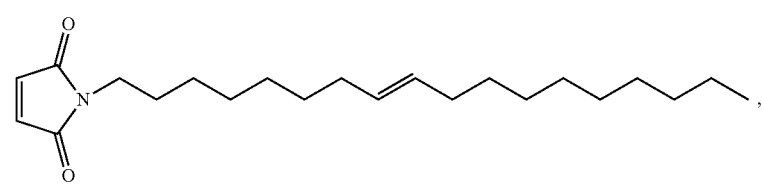

-continued
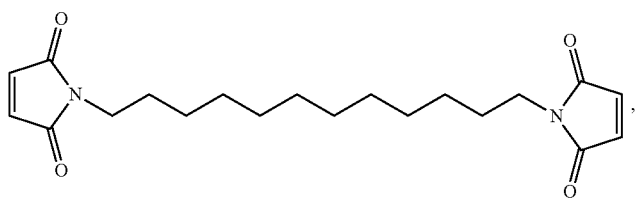
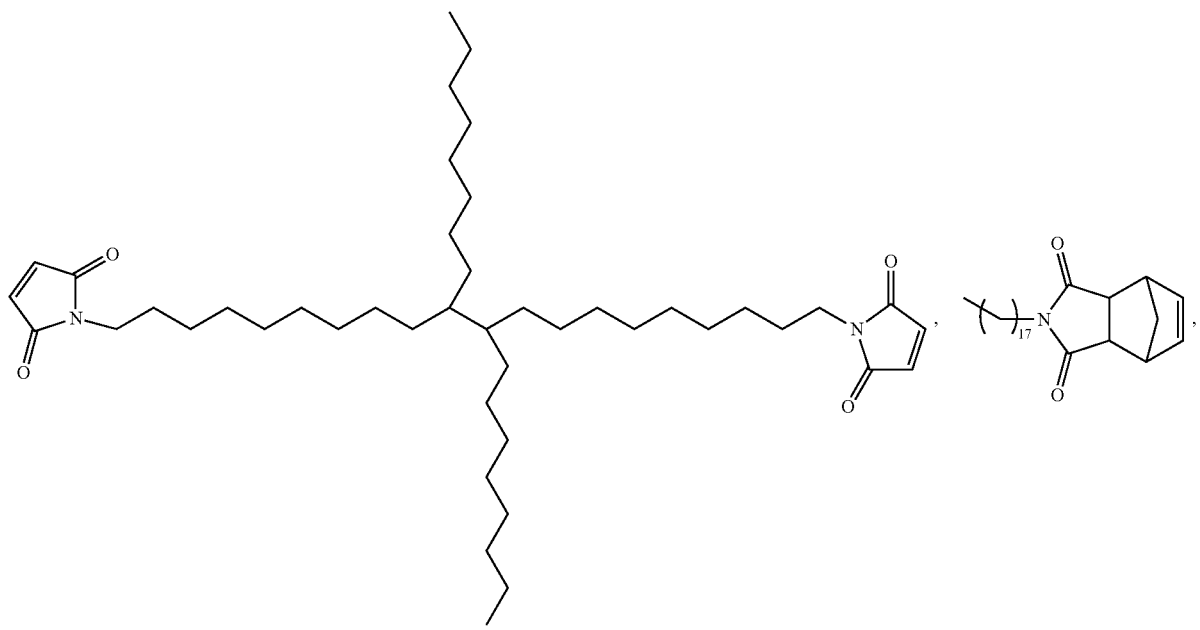
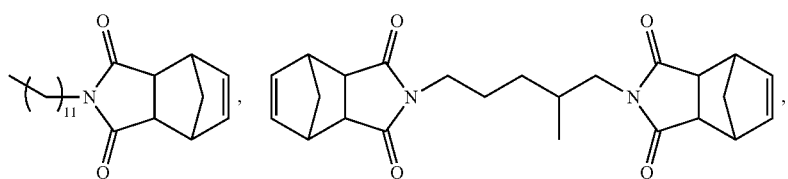
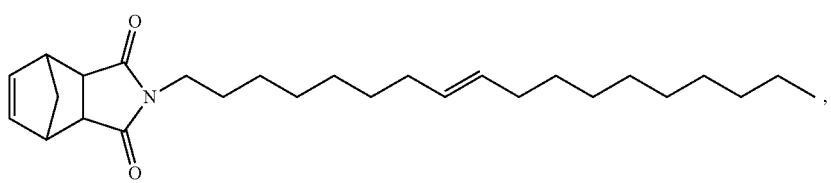
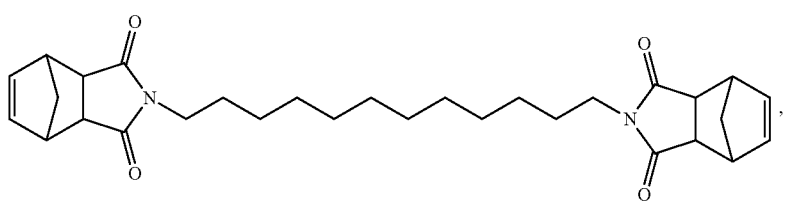

-continued
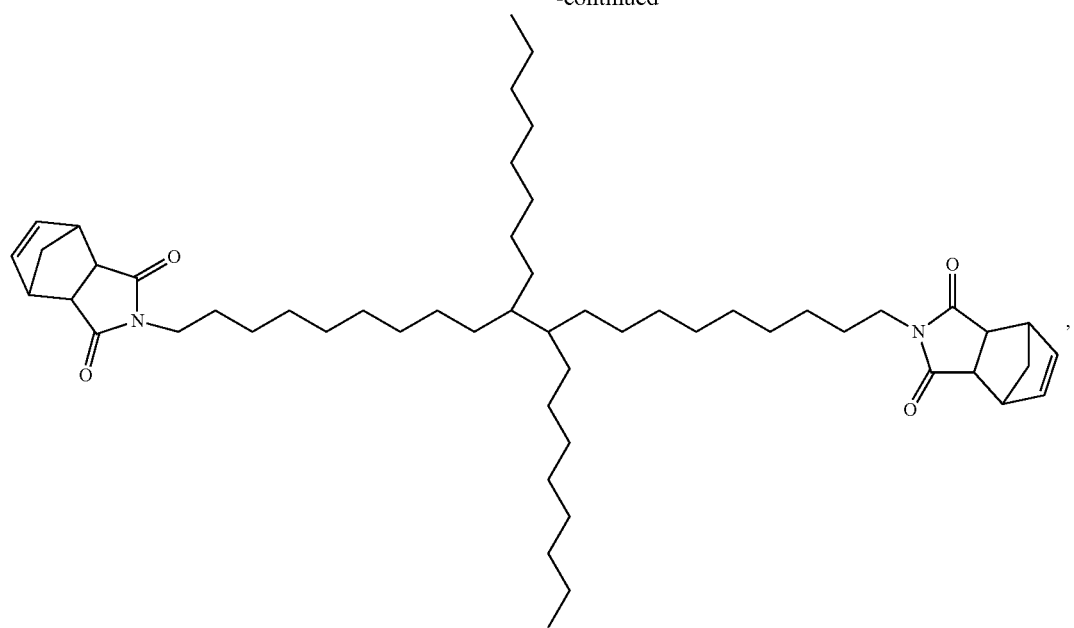
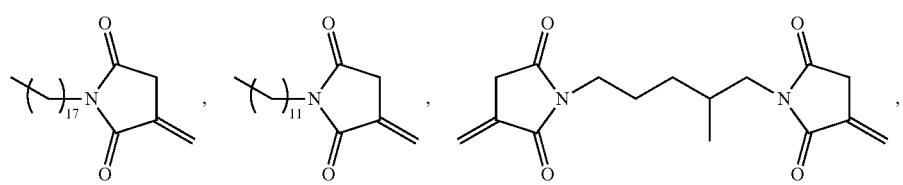
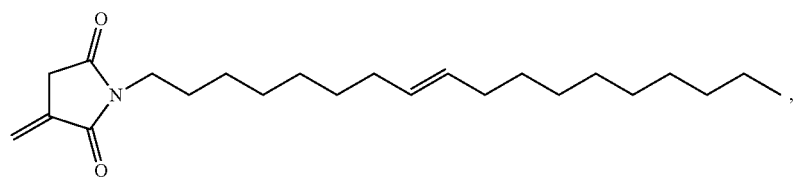
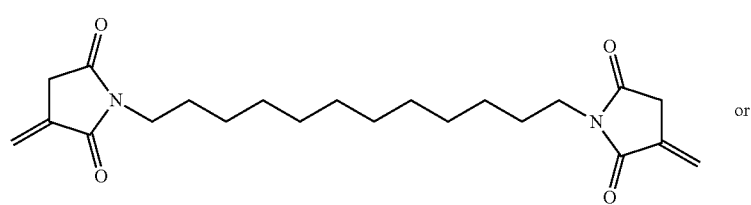 or

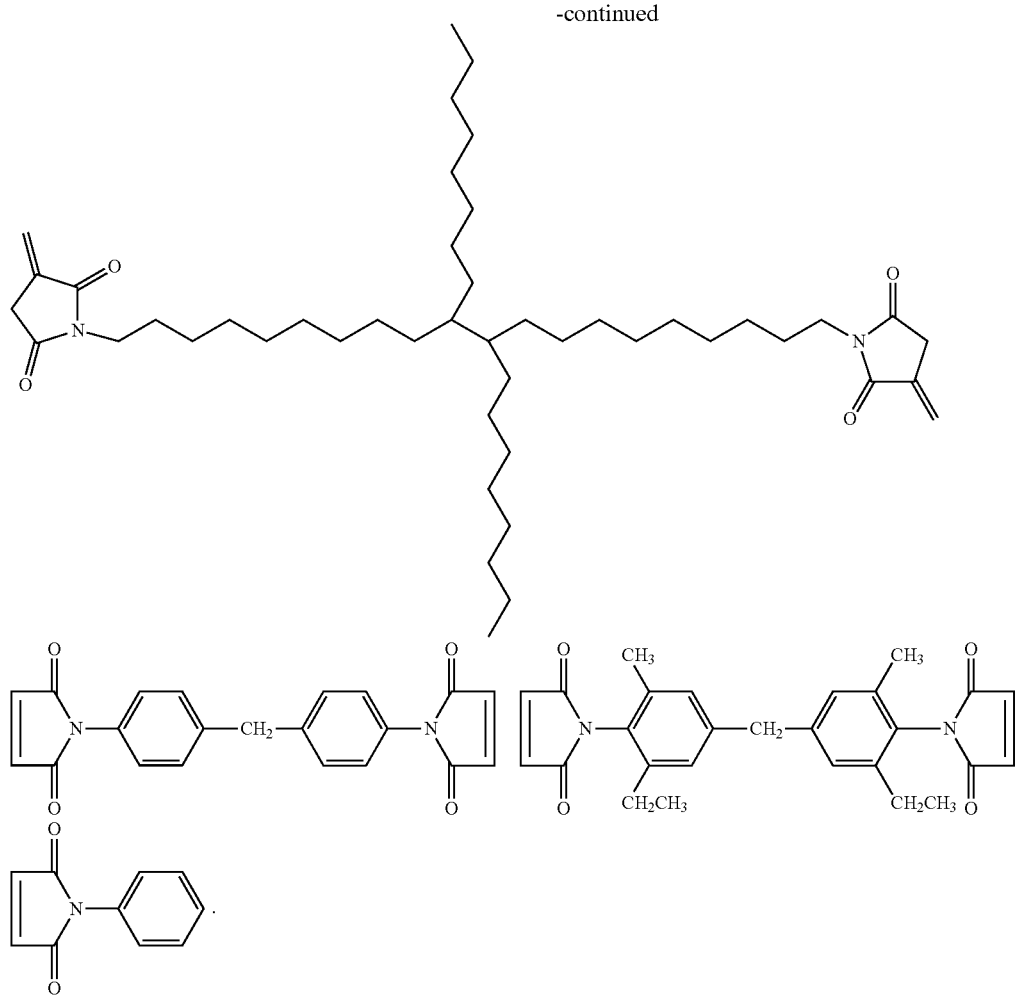

The maleimides, nadimides or itaconimides should be present in the composition in an amount which the range of about 10 percent by weight to about 95 percent by weight, desirably about 20 percent by weight to about 80 percent by weight, such as about 60 percent by weight, based on the total weight of the thermosetting resin matrix.

As a filler component, many materials are potentially useful. For instance, inorganic fillers may be useful, particularly where coefficients of thermal expansion ("CTE") between the semiconductor chip and the substrate to be mated and sealed are to be more closely matched. The filler influences the CTE and thus can be used to reduce thermal expansion of the cured material, thereby reducing warpage. The filler component may often include reinforcing silicas, such as fused spherical silicas, and may be untreated or treated so as to alter the chemical nature of their surface. The filler component however should include particles having a mean particle size distribution in the 0.1 to 75 micron range, such as 0.1 to 50 micron range. A commercially available example of such particles is sold by Tatsumori or Denka in Japan. In addition, nano-size silica powder might be added, such as those sold under the tradename NANOPDX by Nanoresins, Germany. NANOPDX fillers are monodisperse silica filler dispersions in epoxy resins, at a level of up to about 50 percent by weight, available from Nanoresins, Germany. NANOPDX fillers ordinarily are believed to have a particle size of about 5 nm to about 80 nm.

Nanoresins also produces materials under the NANOPDX E trade designations. For instance, Nanoresins reports NANOPDX E-brand products enable the complete impregnation of electronic components which are difficult to seal otherwise and provide a large spectrum of mechanical and thermal properties such as reduced shrinkage and thermal expansion, fracture toughness and modulus. In the table below, Nanoresins-provided information on the four noted NANOPDX E products is set forth:

| Type | SiO2 - Content [wt %] | Base resin | EEW [g/eq.] | Dyn. Visc., 25° C. [mPa · s] |
|---|---|---|---|---|
| NANOPOX E 430 | 40 | DGEBA/ DGEBF | 290 | 45,000 |
| NANOPOX E 470 | 40 | DGEBA[1] | 295 | 60,000 |
| NANOPOX E 500 | 40 | DGEBF[2] | 275 | 20,000 |
| NANOPOX E 600 | 40 | EEC[3] | 220 | 4,000 |

[1] diglycidyl ester of bisphenol
[2] diglycidyl ester of bisphenol
[3] 3,4-epoxycyclohexylmethyl-3,4-epoxycyclohexylcarbonate Nanoresins reports that important properties can be significantly improved in epoxy formulations by using NANOPDX E-brand products. For instance:
- lower viscosity of the formulation in comparison to conventional reinforced fillers
- no sedimentation
- increase in the fracture toughness, impact resistance and modulus
- improved scratch and abrasion resistance
- reduction of shrinkage and thermal expansion
- improvement, or at least no negative effect, in numerous desired properties, such as thermal stability, chemical resistance, glass transition temperature, weathering resistance, and dielectric properties.

The processability is essentially unchanged in comparison to the respective base resin.

According to the manufacturer, NANOPDX E-brand products are a colloidal silica sol in an epoxy resin matrix. The dispersed phase consists according to the manufacturer of surface-modified, spherically shaped $SiO_2$ nanoparticles with diameters below 50 nm and an extremely narrow particle size distribution. These spheres, only a few nanometers in size, are distributed agglomerate-free in the resin matrix. This according to the manufacturer produces a very low viscosity of the dispersion with $SiO_2$ content of up to 40 percent by weight. As reported by the manufacturer, the nanoparticles are chemically synthesized from aqueous sodium silicate solution. In this process the binding agent is not damaged, in contrast to processes in which powdered fillers are dispersed with dissolvers or other equipment using high shear energy.

Other desirable materials for use as a filler component include those constructed of or containing aluminum oxide, silicon nitride, aluminum nitride, silica-coated aluminum nitride, boron nitride and combinations thereof.

The filler component, when used, should be used in an amount of about 50 to about 90 percent by weight of the composition, such as about 60 to about 90 percent by weight, desirably within the range of about 70 to about 90 percent by weight, based on the total weight of the composition.

The cure component should be a latent one.

The cure component includes the combination of (1) a clathrate (such as a tetrakis phenol compound) and a (2) nitrogen containing compound, such as imidazole and derivatives thereof. Examples of the clathrate as noted above include tetrakis phenol compounds, such as 1,1,2,2-tetrakis(4-hydroxyphenyl)ethane, 1,1,2,2-tetrakis(3-methyl-4-hydroxyphenyl)ethane, 1,1,2,2-tetrakis(3,5-dimethyl-4-hydroxyphenyl)ethane, 1,1,2,2-tetrakis(3-chloro-4-hydroxyphenyl)ethane, 1,1,2,2-tetrakis(3,5-dichloro-4-hydroxyphenyl)ethane, 1,1,2,2-tetrakis(3-bromo-4-hydroxyphenyl)ethane, 1,1,2,2-tetrakis(3,5-dibromo-4-hydroxyphenyl)ethane, 1,1,2,2-tetrakis(3-t-butyl-4-hydroxyphenyl)ethane, 1,1,2,2-tetrakis(3,5-di-t-butyl-4-hydroxyphenyl)ethane, 1,1,2,2-tetrakis(3-fluoro-4-hydroxyphenyl)ethane, 1,1,2,2-tetrakis(3,5-difluoro-4-hydroxyphenyl)ethane, 1,1,2,2-tetrakis(3-methoxy-4-hydroxyphenyl)ethane, 1,1,2,2-tetrakis(3,5-dimethoxy-4-hydroxyphenyl)ethane, 1,1,2,2-tetrakis(3-chloro-5-methyl-4-hydroxyphenyl)ethane, 1,1,2,2-tetrakis(3-bromo-5-methyl-4-hydroxyphenyl)ethane, 1,1,2,2-tetrakis(3-methoxy-5-methy-4-hydroxyphenyl)ethane, 1,1,2,2-tetrakis(3-t-butyl-5-methyl-4-hydroxyphenyl)ethane, 1,1,2,2-tetrakis(3-choro-5-bromo-4-hydroxyphenyl)ethane, 1,1,2,2-tetrakis(3-chloro-5-phenyl-4-hydroxyphenyl)ethane, 1,1,2,2-tetrakis[(4-hydroxy-3-phenyl)phenyl]ethane, 1,1,3,3-tetrakis(4-hydroxyphenyl)propane, 1,1,3,3-tetrakis(3-methyl-4-hydroxyphenyl)propane, 1,1,3,3-tetrakis(3,5-dimethyl-4-hydroxyphenyl)propane, 1,1,3,3-tetrakis(3-chlor-4-hydroxyphenyl)propane, 1,1,3,3-tetrakis(3,5-dichloro-4-hydroxyphenyl)propane, 1,1,3,3-tetrakis(3-bromo-4-hydroxyphenyl)propane, 1,1,3,3-tetrakis(3,5-dibromro-4-hydroxyphenyl)propane, 1,1,3,3-tetrakis(3-phenyl-4-hydroxyphenyl)propane, 1,1,3,3-tetrakis(3,5-diphenyl-4-hydroxyphenyl)propane, 1,1,3,3-tetrakis(3-methoxy-4-hydroxyphenyl)propane, 1,1,3,3-tetrakis(3,5-dimethoxy-4-hydroxyphenyl)propane, 1,1,3,3-tetrakis(3-t-butyl-4-hydroxyphenyl)propane, 1,1,3,3-tetrakis(3,5-di-t-butyl-4-hydroxyphenyl)propane, 1,1,4,4-tetrakis(4-hydroxyphenyl)butane, 1,1,4,4-tetrakis(3-methyl-4-hydroxyphenyl)butane, 1,1,4,4-tetrakis(3,5-dimethyl-4-hydroxyphenyl)butane, 1,1,4,4-tetrakis(3-chloro-4-hydroxyphenyl)butane, 1,1,4,4-tetrakis(3,5-dichloro-4-hydroxyphenyl)butane, 1,1,4,4-tetrakis(3-methoxy-4-hydroxyphenyl)butane, 1,1,4,4-tetrakis(3,5-dimethoxy-4-hydroxyphenyl)butane, 1,1,4,4-tetrakis(3-bromo-4-hydroxyphenyl)butane, 1,1,4,4-tetrakis(3,5-dibromo-4-hydroxyphenyl)butane, 1,1,4,4-tetrakis(3-t-butyl-4-hydroxyphenyl)butane, 1,1,4,4-tetrakis(3,5-di-t-butyl-4-hydroxyphenyl) butane and combinations thereof.

The nitrogen containing compounds include amines, amides, and imidazoles, to name a few.

As amines, for examples, aliphatic amines, alicyclic and heterocyclic amines, aromatic amines, and modified amines may be used.

As aliphatic amines, some or all of ethylenediamine, trimethylenediamine, tetramethylenediamine, hexamethylenediamine, diethylenetriamine, triethylenetetramine, tetraethylenepentamine, dipropylenediamine, dimethylaminopropylamine, diethylaminopropylamine, trimethylhexamethylenediamine, pentanediamine, bis(2-dimethylaminoethyl)ether, pentamethyldiethylenetriamine, alkyl-t-monoamine, 1,4-diazabicyclo(2,2,2)octane(triethylenediamine), N,N,N',N'-tetramethylhexamethylenediamine, N,N,N',N'-tetramethylpropylenediamine, N,N,N',N'-tetramethylethylenediamine, N,N-dimethylcyclohexylamine, dimethylaminoethoxyethoxy ethanol, dimethylaminohexanol and combinations thereof may be used.

As alicyclic and heterocyclic amines, some or all of piperidine, piperidine, menthanediamine, isophoronediamine, methylmorpholine, ethylmorpholine, N,N',N"-tris (dimethylaminopropyl)hexahydro-s-triazine, 3,9-bis(3-aminopropyl)-2,4,8,10-tetraoxyspiro(5,5)undecaneadacto, N-aminoethylpiperidine, triethylaminoethylpiperadine, bis (4-aminocyclohexyl)methane, N,N'-dimethylpiperadine, 1,8-diazabicyclo(4,5,0)undecene-7 and combinations thereof may be used.

As aromatic amines, o-phenylenediamine, m-phenylenediamine, p-phenylenediamine, diaminodiphenylmethane, diaminodiphenylsulfone, benzylmethylamine, dimethylbenzylamine, m-xylenediamine, pyridine, picoline and combinations thereof may be used.

As modified polyamines, polyamines added with epoxy compounds, polyamines added by Michael reaction, polyamines added by Mannich reaction, polyamines added with thiourea, ketone-blocked polyamines and combinations thereof may be used.

As imidazoles, some or all of imidazole and derivatives thereof, such as isoimidazole, imidazole, alkyl substituted imidazoles, such as 2-methyl imidazole, 2-ethyl-4-methyl-imidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-phenylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole and the like, generally where each alkyl substituent contains up to about 17 carbon atoms and desirably up to about 6 carbon atoms; aryl substituted imidazoles, such as phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, 2-phenyl-4, 5-dihydroxymethylimidazole (commercially available under the tradename 2PHZ from Shikoku, Tokyo, Japan) and combinations thereof may be used.

Commercially available examples of the imidazoles include imidazole from Sigma-Aldrich Corporation, CUREZOL 1B2MZ (benzyl-2-methylimidazole) and CUREZOL 2P4MZ (2-phenyl-4-methylimidazole), each available commercially from Air Products and Chemicals Inc., and ARBADUR 9719-1 (2-ethyl-4-methylimidazole) from Huntsman Advanced Materials Americas Inc.

As amide compounds, polyamides obtainable by means of polymerization of dimaric acid and polyamine can be given, and as examples for ester compounds, active carbonyl compounds, such as aryl and thioaryl esters of carboxylic acids, may be used.

As other nitrogen containing compounds, dicyandiamide, quanidine, organic acid hydrazides, diaminomaleonitrile, amineimide, trifluoroboron-piperidine complex, trifluoroboron-monoethylamine complex and combinations thereof may be used.

The ratio of clathrate to nitrogen containing compounds should be about 2.5:1 to about 0.5:1, on a by mole basis.

Commercially available cure components include those from Nippon Soda under the tradename NISSOCURE.

The cure component should be included in an amount of about 0.1 percent by weight to about 20 percent by weight, such as about 2 percent by weight to about 12 percent by weight, based on the total resin composition.

A variety of additives may be included as illustrated in the examples below. Of particularly note, however, are the dispersants, such as those available commercially from BYK Chemie under the DYSPERBYK tradename.

The following examples are provided for illustrative purposes.

Examples

A reconfigured wafer is ordinarily constructed today to have an 8" or 12" diameter. In use, the thermosetting resin composition used to encapsulate the wafer may be dispensed by air pressure or by piston dispense on or about a central portion of the wafer. Besides a reconfigured wafer, the inventive LCM may be molded onto a blank wafer and a trenched wafer as well.

Exposure to liquid compression molding conditions, such as at a temperature of about 110° C. to 130° C. for a period of time of about 120 to 420 seconds, follows. See e.g. FIG. 1. After such exposure, the compression molded wafer may be placed into a conventional oven for a post mold cure at a temperature about 120° C. to less than about 150° C., such as at a temperature about 120° C. to about 130° C., for a period of time of about 15 minutes to 1 hour. Desirably, a 8", 600 um thick molded wafer should demonstrate warpage about less than about 3 mm bow across of the wafer.

Two control compositions (Sample Nos. 1 and 2) were prepared, one with a block copolymer (consistent with U.S. Pat. No. 9,263,360) and the other without. Sample No. 2 had FORTEGRA-100 as the block copolymer. Each control composition was based on a thermoset resin, silica filler, curative, additives and a coloring agent. In addition, four compositions (Sample Nos. 3-6) were prepared in accordance with the present invention. All compositions were evaluated for viscosity stability and were applied to a carrier on which is disposed silicon chips and molded as described above.

Viscosity stability is measured by placing the compositions at room temperatures into a rheometer (ARES) to measure a viscosity profile at various shearing speed (T=25° C., gap=0.5 mm, plate diameter=25 mm) at an initial time (t=0 hour) and after 24 hours to compare the viscosity increase.

Warpage of the molded wafer can be measured by a Nikon NEXIV scanning system, or by using a Shadow Moirè in the X- and Y-directions, or by being estimated by a ruler as well.

The warpage of the molded wafer was measured after the molding and post-mold process.

Reference to Table 1 below shows the control compositions (Sample Nos. 1 and 2) and four inventive compositions (Sample Nos. 3-6) formulated with the noted components in the stated amounts.

TABLE 1

| Constituents | | Sample No./Amt(wt %) | | | | | |
|---|---|---|---|---|---|---|---|
| Type | Identity | 1 | 2 | 3 | 4 | 5 | 6 |
| Curable Resin | Rezicure 3700 | — | 3.74 | — | — | — | — |
| | RSL-1462[1] | — | 1.11 | — | — | — | — |
| | RSL-1739/ Carbon Black premix [2] | 0.44 | 0.56 | 1.32 | 1.32 | 1.32 | 1.20 |
| | ARALDITE MY 0510 | 0.74 | 0.92 | 3.48 | 3.48 | 3.48 | 2.40 |
| | CYRACURE UVR-6105[3] | 1.18 | 1.50 | — | — | — | — |
| | Naphthalene epoxy[5] | — | — | 4.60 | 4.60 | 4.60 | 5.40 |
| | Epoxy diluent | 0.74 | 0.92 | 1.30 | 1.30 | 1.30 | 1.30 |

TABLE 1-continued

| Constituents | | Sample No./Amt(wt %) | | | | | |
|---|---|---|---|---|---|---|---|
| Type | Identity | 1 | 2 | 3 | 4 | 5 | 6 |
| Silica | MSV-8000 | 46.80 | 42.47 | 41.34 | 41.34 | 41.34 | 79.10 |
| Filler | MSR-8030 | 43.00 | 39.02 | 45.66 | 45.66 | 45.66 | 7.90 |
|  | AEROSIL R8200 | 0.20 | — | — | — | — | — |
| Curative | CUREZOL 1B2MZ | 0.20 | — | — | — | — | — |
|  | ECA 300D[4] | 5.26 | — | — | — | — | — |
|  | TPP/BQ | — | 0.21 | — | — | — | — |
|  | 2P4Mz | — | — | — | — | — | — |
|  | KM 110 | — | — | 0.60 | 0.90 | 1.50 | 0.90 |
|  | ADRADUR 9719-1 | — | — | — | — | — | 0.40 |
| Block Copolymer | FORTEGRA-100 | — | 3.79 | — | — | — | — |
| Additives | SILQUEST A-187 J | 0.15 | 0.11 | 0.20 | 0.20 | 0.20 | 0.20 |
|  | SILRES HP-1250 | 0.35 | 0.45 | 0.35 | 0.35 | 0.35 | 0.40 |
|  | Defoamer | 0.05 | 0.06 | 0.05 | 0.05 | 0.05 | — |
|  | Dispersant[6] | — | — | 0.80 | 0.80 | 0.80 | 0.80 |

[1] Bisphenol A epoxy resin, Resolution Performance Products LLC, Houston, TX
[2] Bisphenol F epoxy resin, Resolution Performance Products LLC, Houston, TX. Used to make a carbon black premix
[3] Cycloaliphatic epoxy
[4] Alicyclic anhydride
[5] HP4032D
[6] DYSBERBYK 145 (1,2-Ethanediamine, polymer with aziridine, N-[3-[(2-ethylhexyl)oxy]-3-oxypropyl] dervs., compds. with polyethylene-polypropylene glycol)

The compositions were each prepared by mixing together the noted constituents with a mechanical mixer until dissolution to a homogeneous solution was observed. The silica filler was then added with continued mixing for a period of time of about 30-60 minutes at room temperature until a viscous paste with a substantially uniform consistency was achieved. The samples were then transferred into containers until ready for use.

The compositions are dispensed onto and about the center of a Silicon wafer as a carrier. After compression molding at a temperature of about 120° C. to less than about 130° C. for a period of time of about 200 seconds to about 400 seconds, the composition was observed to be about 60 to about 80% cured, though with a tack free surface. Then, the so-molded wafer was placed into a conventional oven for post mold cure at a temperature of about 120° C. to about 150° C. for a period of time of about 15 minutes to about 1 hour.

In their intended use, the inventive compositions may be dispensed onto the active side of a reconfigured wafer and molded under increased pressure (about 98 KN) and at an elevated temperature of about 110° C. to about 130° C. for a period about 3 minutes to about 7 minutes. The molded wafer assembly may then be exposed to an elevated temperature of about 130° C. to about 150° C. for a period of time of about 1 hour to about 2 hours. Desirably, with 200 um cured material, an 8", 600 um thick silicon wafer should demonstrate warpage about less than about 3 cm, desirably less than about 2 cm, after post mold cure.

The molded wafer may be debonded, coated with a redistribution layer, solder bumps applied and thereafter diced into single semiconductor packages.

Reference to Table 2 below shows certain physical properties observed, including mechanical properties such as modulus, CTEs ($\alpha_1$ or 1, and $\alpha_2$ or 2), and Tg were measured after the samples were first exposed to compression molding conditions of a temperature of about 120° C. to less than about 130° C. for a period of time of about 200 seconds to about 400 seconds exposed for a further period of time of about 15 minutes to about 1 hour to a temperature of about 120° C. to about 150° C. in an oven.

TABLE 2

| Physical | Sample Nos. | | | | | |
|---|---|---|---|---|---|---|
| Properties | 1 | 2 | 3 | 4 | 5 | 6 |
| Warpage after oven cure (cm) | 3.7 | 0.4 | 2.0 | 0.06 | 0 | 2.0 |
| Viscosity change at 25° C. after 24 hours (%) | 55 | 35 | 14 | 16 | 20 | 18 |
| Tg (° C.) by TMA | 138 | 103 | 148 | 154 | 159 | 172 |
| CTE 1, ppm/° C. | 8 | 4.1 | 7 | 7 | 6 | 5 |
| CTE 2, ppm/° C. | 30 | 37 | 29 | 25 | 25 | 23 |
| Tg (° C.) by DMA by tanδ | 161 | −50, 87 | 169 | 180 | 196 | 192 |
| Storage modulus @ 25° C. (GPa) | 29.5 | 7.5 | 19.9 | 23.2 | 24 | 26.9 |

"Standard Test Method for Linear Thermal Expansion of Solid Materials by Thermomechanical Analysis," ASTM International Designation: E831-06, published April 2006 ("E831-06") describes a test method that "determines the apparent coefficient of linear thermal expansion of solid materials using thermomechanical analysis techniques." See E831-06 at paragraph 1.1. This common method was used to measure CTE $\alpha_1$ or 1.

"Standard Test Method for Plastics: Dynamic Mechanical Properties: In Flexure (Three-Point Bending)," ASTM International Designation: D 5023-01, published November 2001 ("D 5023-01") discloses a test method that "is intended to provide means for determining the modulus as a function of temperature for a wide variety of plastics materials." See D 5023-01 at paragraph 1.2, emphasis added. This common method was used to measure storage modulus.

To achieve high Tg and low warpage on flip chip semiconductor packaging, low temperature curing conditions (below about 130° C.), with compositions that exhibit fast gellation after exposure to such low temperature curing conditions have been shown to influence warpage. The Tg of the cured composition should be equal to or higher than the temperature used to cure the composition; the Tg should be higher than 90° C., desirably above 125° C. If the composition cures slowly or at a higher temperature, the stress free point between the die and substrate set is high. Warpage at room temperature results from cooling the compression molded semiconductor package to room temperature from the cure temperature.

To achieve high reliability for thermal cycle performance between −55° C. to 125° C. of such compression molded semiconductor packages, the liquid compression molding material should have Tg by TMA after reflow at 260° C. above 90° C. and desirably above 125° C., a DSC peak below 140° C., a delta temperature between the onset and the peak on DSC below 20° C.

As shown in Table 2, one of the control compositions (Sample No. 1) shows high Tg and low CTE. However, this composition demonstrates two issues: (1) viscosity increase of more than 30% after 24 hour room temperatures storage and (2) large warpage after curing, well above 3 cm.

The other control composition (Sample No. 2) showed much improved warpage—about 0.4 cm. But this composition also demonstrated a viscosity increase of more than 30% after 24 hour room temperatures storage.

The inventive compositions show both improved viscosity stability and decreased warpage. More specifically, Sample No. 3 demonstrated a viscosity increase of less than 30% after 24 hour room temperatures storage. And Sample No. 3 demonstrated improved warpage—2.0 cm.

Similarly, Sample No. 4 also demonstrated such viscosity behavior and warpage of 0.06 cm while Sample No. 5 did so too for viscosity and showed zero warpage.

Sample No. 6 showed improved viscosity stability after 24 hour room temperature storage and improved warpage resistance—2.0 cm.

The inventive compositions achieve the following properties:
a) When cured, storage modulus in the range of 25 GPas or less at room temperature (25° C.), measured by DMA (3-point bending method, at 5° C./min),
b) When cured, a CTE α1 of less than or equal to 15 ppm, and a CTE α2 of less than or equal to 30 ppm, measured by TMA (at ramp rate of 5° C./min),
c) When cured, at least one Tg above 135° C., measured by TMA (3-point bending method, at ramp rate of 5° C./min),
d) As an encapsulant, a viscosity change of less than 30% in 24 hours at room temperature (25° C.), measured by rheometer (ARES rheometer from TI).

What is claimed is:

1. A thermosetting resin composition, comprising a thermosetting resin matrix, a silica filler and a cure component comprising the combination of a clathrate comprising a tetrakis phenol compound and a nitrogen-containing curative,
wherein the composition has a viscosity increase after 24 hour room temperature storage of less than about 30% relative to an initial viscosity of the composition before storage, and
wherein, when cured on a wafer, the wafer including the cured composition exhibits a warpage of less than about 3 cm after oven cure.

2. The composition according to claim 1, wherein, when cured, the cured composition has the following set of physical properties:
(a) storage modulus in the range of about 25 gigapascals (GPas) or less at room temperature,
(b) a coefficient of thermal expansion (CTE) α1 of less than or equal to 15 ppm,
(c) a CTE α2 of less than or equal to 30 ppm and
(d) multiple glass transition temperatures (Tgs) as measured by thermal mechanical analysis (TMA) of greater than about 135° C.

3. The composition according to claim 1, wherein when cured the cured composition exhibits multiple Tgs as measured by TMA of greater than about 160° C. and, wherein when cured on a wafer, the wafer including the cured composition exhibits a warpage of less than about 2 cm, as measured by molding a 200 μm thick layer of the composition onto a 600 μm thick, 8" silicon wafer at temperature of about 130° C. to about 150° C. for a period of time of about 10 minutes to about 1 hour.

4. The composition according to claim 1, wherein the wafer is constructed of silicon and the composition is disposed on the wafer at a thickness of less than about 50 percent of a thickness of the wafer.

5. A method of improving warpage resistance of a molded wafer encapsulated by the thermosetting resin composition according to claim 1, steps of the method comprising:
providing a wafer;
providing the thermosetting resin composition according to claim 1 in contact with the wafer; and
exposing the wafer and the thermosetting resin composition to conditions favorable to allow the thermosetting resin composition to flow about the wafer and cure to a reaction product of the thermosetting resin composition, wherein the cured reaction product of the thermosetting resin composition is capable of improving warpage resistance of the molded wafer with the cured reaction product of the thermosetting resin composition by about 50% or greater as compared with a molded wafer with a material other than the cured reaction product of the thermosetting resin composition.

6. The method according to claim 5, wherein the warpage resistance of the molded wafer with the cured reaction product of the thermosetting resin composition is improved by about 65% or greater as compared with a molded wafer with a material other than the cured reaction product of the thermosetting resin composition.

7. The method according to claim 5, wherein the warpage resistance of the molded wafer with the cured reaction product of the thermosetting resin composition is improved by about 80% greater as compared with a molded wafer with a material other than the cured reaction product of the thermosetting resin composition.

8. A product formed from the method of claim 5.

9. The composition of claim 1 wherein the thermosetting resin matrix comprises an epoxy resin component, an episulfide resin component, an oxazine component, an oxazoline component, a cyanate ester component, and/or a maleimide-, a nadimide- or an itaconimide-containing component.

* * * * *